United States Patent [19]

Winroth

[11] Patent Number: 4,764,694
[45] Date of Patent: Aug. 16, 1988

[54] INTERPOLATING TIME-MEASUREMENT APPARATUS

[75] Inventor: Calvin S. Winroth, Acton, Mass.

[73] Assignee: GenRad, Inc., Concord, Mass.

[21] Appl. No.: 41,855

[22] Filed: Apr. 22, 1987

[51] Int. Cl.[4] .......................... H03K 5/26; H03K 17/28
[52] U.S. Cl. ...................................... 307/602; 307/246;
       307/480; 307/603; 328/129.1; 377/20; 364/569
[58] Field of Search .......................... 307/246, 602, 603

[56] References Cited

U.S. PATENT DOCUMENTS

| | | | |
|---|---|---|---|
| Re. 31,551 | 4/1984 | Bjorke | 307/603 |
| 3,467,838 | 9/1969 | Glazebrook et al. | 307/603 |
| 3,668,529 | 6/1972 | Meyer | 328/129.1 |
| 3,970,828 | 7/1976 | Klein | 377/20 |
| 4,303,983 | 12/1981 | Chaborski | 364/569 |
| 4,584,494 | 4/1986 | Arakawa et al. | 307/246 |
| 4,620,788 | 11/1986 | Giger | 328/129.1 |
| 4,685,075 | 8/1987 | Murita | 364/569 |
| 4,687,998 | 8/1987 | Takatori | 307/246 |

*Primary Examiner*—John S. Heyman
*Attorney, Agent, or Firm*—Cesari and McKenna

[57] ABSTRACT

A time-measurment circuit (10) employs time-expansion circuits (13 and 14) to expand the initial and final portions of the duration of an event so as to measure more precisely those segments of time that typically are not integral numbers of clock periods in length. Each time-expansion circuit (13 and 14) employs a single capacitor (34), which it charges at a rapid rate during the initial or final time segment to be measured and then discharges at a much lower rate. The clock periods that occur during the time required for charging and discharging are counted, so the initial and final segments are measured with greatly enhanced resolution. An emitter-coupled-logic integrated circuit (54) performs the charging of the capacitor (34) by drawing current through its $V_{CC1}$ terminal (62).

3 Claims, 4 Drawing Sheets

INTERPOLATING TIME-MEASUREMENT APPARATUS

BACKGROUND OF THE INVENTION

The present invention is directed to time-measurment circuitry. It is directed particularly to digital measurement of very short time periods.

A convenient method of obtaining a digital duration measurement is to employ a high-frequency clock signal having a very stable frequency and to count the number of clock pulses that occur between two events whose separation in time is to be measured. A counter circuit counts the clock pulses, and the counter output is a digital quantity directly proportional to the duration of the event.

This method is repeatable and precise so long as the period of the clock is quite short with respect to the duration of the event. When the order of magnitude of the event duration approaches that of the clock period, however, the percentage error becomes significant, so one ordinarily increases the frequency of the clock as the duration to be measured becomes shorter. When the duration is extremely short, however, practical considerations preclude further increases in clock frequency.

Methods have therefore been proposed for modifying the pulse-counting method so as to increase its accuracy and resolution. These methods are directed to accurate measurement of the times between the first event and the first clock pulse thereafter and between the second event and first clock pulse after that. It is these times that the basic pulse-counting technique cannot measure, and it is these times that become significant when the duration to be measured is not large in comparison with the clock period.

One such method is described in U.S. Pat. No. 4,303,983 to Chaborski. The apparatus depicted in that patent employs a "time-to-amplitude converter," presumably a device for linearly charging a capacitor, to measure the time between the first event and the next clock pulse. A time-to-amplitude circuit also measures the time between the last clock pulse and the second event. Analog-to-digital converters convert the analog outputs of the time-to-amplitude converters into digital signals. With appropriate scaling, the quantities represented by these digital signals are added to those represented by the counter output, and the result is the desired measurement.

The Chaborski arrangement thus improves the accuracy of the counter-type time-measuring scheme, but it requires the real-time use of analog-to-digital converters.

U.S. Pat. No. 3,970,828 to Klein describes an arrangement that avoids the use of conventional analog-to-digital converters. Like the Charborski circuit, the Klein circuit charges a capacitor between the first event and the time at which the first clock pulse occurs. However, rather than employ a conventional analog-to-digital converter, the Klein arrangement uses the same counter that it uses for coarse measurement as a means for achieving analog-to-digital conversion in the fine measurement.

Specifically, a slow-charging capacitor and a fast-changing capacitor in the Klein circuit both begin charging upon the occurrence of the first event. The fast-charging capacitor is charged only between the first event and the next clock pulse, and it then holds the resultant voltage for comparison with the voltage on the slow-charging capacitor. The slow-charging capacitor keeps charging after the first clock pulse, and the Klein circuit counts the number of pulses that occur in the time that it takes for the slow-charging capacitor to reach the voltage held by the fast-charging capacitor. The slow-charging capacitor charges much more slowly than the fast-charging capacitor does, and many clock pulses occur while the slow-charging capacitor charges if the time between the first event and the next clock pulse is any significant fraction of the clock period. The Klein arrangement therefore determines the duration of the initial time segment very precisely. It measures the terminal time segment similarly, and it thereby makes a precise measurement of the time separation between the events.

SUMMARY OF THE INVENTION

The present invention is a precision time-measurement circuit that, like the Klein arrangement, employs the clock signal for both the coarse and the fine time measurements, but it does not require separate fast- and slow-charging capacitors. In accordance with the present invention, one capacitor is charged at a relatively rapid rate during the time between the first event and a subsequent (typically the second) clock pulse thereafter, and another capacitor is charged at a relatively rapid rate during the time between the second event and a subsequent clock pulse. Rather than employ a separate slow-charging capacitor, however, Applicant's arrangement then discharges the capacitors at a slow rate until they return to the voltages at which the initial charging began. Counts of the numbers of clock pulses that occur during this discharging time give accurate indications of the initial and final time segments, and these indications are combined with the coarse measurement—i.e., with the number of clock pulses that occur between the two events—to generate a precise duration determination.

BRIEF DESCRIPTION OF THE DRAWINGS

These and further features and advantages of the present invention are described in connection with the accompanying drawings, in which.

DETAILED DESCRIPTION OF THE PREFERRED EMBODIMENT

Figure 1:
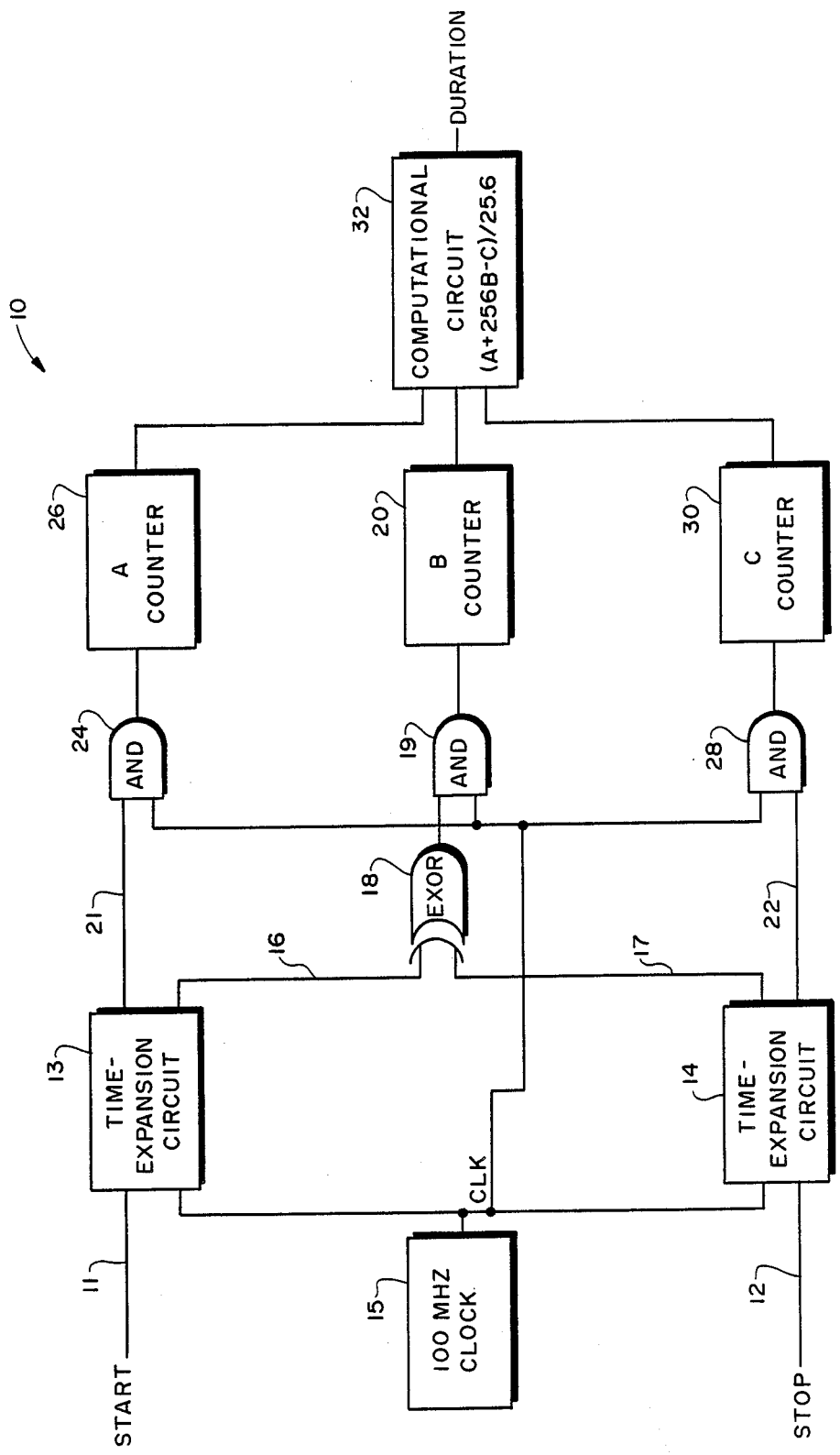
FIG. 1 is a block diagram of the time-measurement circuit of the present invention.

FIG. 1 is a simplified representation of a time-measurement circuit 10 that employs the teachings of the present invention. The purpose of circuit 10 is to measure the difference in time between the occurrences of two events represented by pulses appearing in START and STOP signals on input lines 11 and 12. First and second time-expansion circuits 13 and 14 receive the START and STOP signals, respectively. Each time-expansion circuit also receives the output of a 100-MHz clock 15 and produces an output on a respective one of lines 16 and 17. The output on line 16 goes high on the second or third clock pulse after the START pulse, while that on line 17 goes high on the second or third clock pulse after the STOP pulse. (As will be seen below, the transitions usually occur on the second clock pulse after the START or STOP pulse, but they occur on the third if the first clock pulse occurs only a very short time after the START or STOP pulse.) Accordingly, an exlusive-OR ("XOR") gate 18, which receives these two outputs, produces as its output a pulse whose duration is equal to the length of time between those clock pulses.

(In fact, the duration is longer than this because the second time-expansion circuit delays the STOP pulse by a delay of approximately two clock periods. This extra delay is used to implement an interlock mechanism, which prevents a STOP pulse from being effective until a START pulse has been received. Subsequent circuitry compensates for this additional delay, however, so the circuit operates in principle as though the duration is as described above. For the sake of simplicity, therefore, the description will proceed as though the delays in the two time-expansion circuits were not different.)

An AND gate 19 receives the clock output and the output of the XOR gate 18 so as to gate the clock pulses to a B counter 20 during the XOR-gate pulse. The output of the B counter 20 is thus a coarse measurement of the duration of the input pulse.

Clearly, the measurement represented by the output of counter 20 is subject to inaccuracy because the durations to be measured are not typically integral multiples of the clock period. The actual duration differs from the coarse measurement by an amount that depends on the times between the START and STOP pulses and the clock pulses on which the pulses on lines 16 and 17 begin. In order to measure these initial and terminal segments, the time-expansion circuits 13 and 14 expand the durations of these initial and final time segments and place the resultant expanded pulses on lines 21 and 22, respectively. Specifically, circuit 13 produces an output pulse that is 256 times as long as the initial time segment. This output appears on line 21 and enables an AND gate 24 to admit pulses from the clock 14 to the clock input port of an A counter 26. The output of counter 26 thus represents the duration of the initial time segment, but with a resolution 256 times that with which the output of counter 20 does.

The other time-expansion circuit 14 works in a similar manner; it expands the duration of the time segment between the STOP pulse and the second or third subsequent clock pulse. Its output controls a further AND gate 28 to admit clock signals to a C counter 30. The output of the C counter 30 thus represents, with a resolution 256 times that of the output of counter 20, the duration of the time interval that begins with the STOP pulse and ends with the second or third clock pulse thereafter.

A computation circuit 32 then makes a determination of the total time between the START and STOP pulses. It multiplies the output of counter 20 by 256, adds the output of counter 26, subtracts the output of counter 30, and divides the result by 25.6 to give the time in nanoseconds.

Again, this is a simplified version of the way in which a practical implementation would compute the result, since such an implementation would additionally have to take into account factors such as internal propagation-delay differences between the two input channels. But the formula depicted in block 32 represents the way in which the measurements are combined after these factors have been taken into account. Typically, the compensation for such delay factors can be made by simply adding a constant to the quantity that results from this formula.

Figure 2:
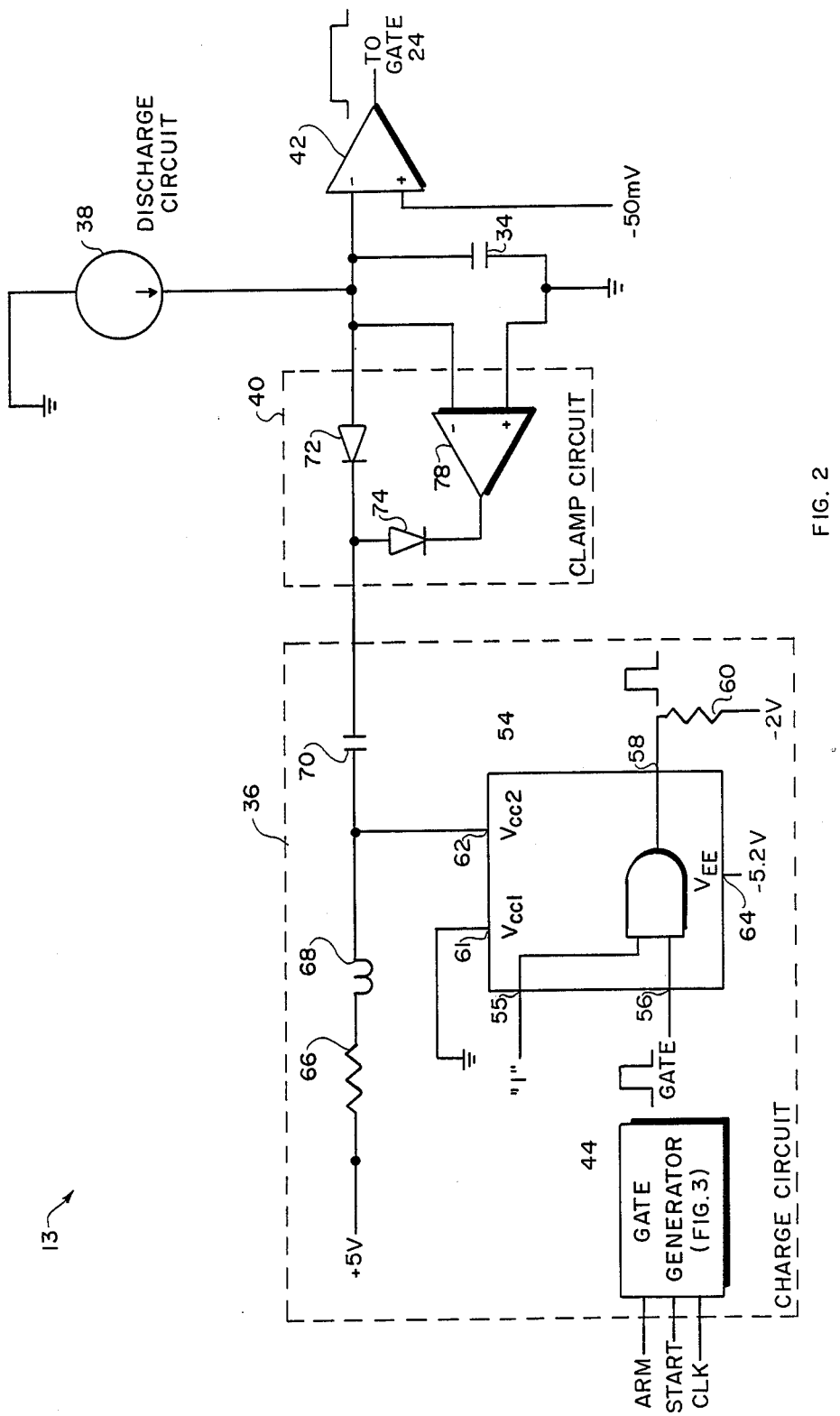
FIG. 2 is a schematic diagram of the time-expansion circuit 20 of FIG. 1.

FIG. 2 depicts the time-expansion circuit 13 in more detail. Time-expansion circuit 13 includes a capacitor 34, which is charged negatively at a fast rate during the time between the START pulse and the second or third subsequent clock pulse and is then discharged slowly from the resulting voltage. Charge and discharge circuits 36 and 38 perform the charging and discharging, respectively. Time-expansion circuit 13 also includes a clamp circuit 40, whose purpose is to permit capacitor 34 to assume negative voltages but prevent it from assuming positive voltages; that is, it clamps capacitor 34 at a virtual-ground potential.

The discharge circuit 38 continually supplies a constant, relatively low current to tend to charge capacitor 34 toward positive voltages. Thus, if capacitor 34 starts at a negative voltage, capacitor 34 discharges linearly toward zero volts at a fixed rate determined by the discharge circuit 38. When the voltage of capacitor 34 reaches zero, however, the clamping circuit 40 begins to divert all of the current supplied by charging circuit 38, so capacitor 34 remains at zero volts. In contrast, the clamp circuit 40 does not resist the action of the charge circuit 36, since it permits negative voltages on capacitor 34.

In operation, the charge circuit 36 begins charging capacitor 34 when the START pulse occurs. Although the clamp circuit 40 has prevented capacitor 34 from charging to positive voltages, it does not prevent it from assuming negative voltages, and capacitor 34 now begins charging negatively. At this point, a comparator 42 detects that the voltage on capacitor 34 has become negative. (More precisely, it determines that the voltage has gone below −50 mV, which is a margin used to avoid spurious outputs from the comparator 42 caused by noise or offset in the clamp circuit 40. The computation circuit 32 adds a quantity to compensate for this 50-mV margin.) Accordingly, the output of comparator 42 goes high, and this high output is the enabling signal for AND gate 24 of FIG. 1; that is, the high output of comparator 42 permits counter 26 to count clock pulses.

Charge circuit 36 continues charging capacitor 34 at a constant, fast rate until the second or third clock pulse occurs. At that point, charge circuit 36 stops charging capacitor 34, but the negative charge on capacitor 34 keeps the output of comparator 42 high. Counter 26 therefore continues to receive and count clock pulses even after charging circuit 36 stops charging the capacitor 34. Once the charging stops, however, the negative voltage on capacitor 34 immediately starts to decrease because the discharge circuit 38 drives current into capacitor 34 at a constant, low rate. The charge circuit 36 draws 256 times the current that the discharge circuit 38 drives. Since the discharge circuit 38 operates simultaneously with the charge circuit 36, however, the rate at which capacitor 34 charges is only 255 times the rate at which it discharges. Consequently, the time required for the discharge circuit 38 to discharge capacitor 34 back to zero is 255 times as long as the time between the START pulse and the second or third subsequent clock pulse.

When the discharge circuit 38 has finally discharged capacitor 34 to the −50 mV threshold applied to the comparator 42, the output of comparator 42 returns to its low level, thereby disabling AND gate 24 so that counter 26 receives no further clock pulses. Counter 26 thus contains a number that is proportional to the duration of the time segment between the START pulse and the second or third subsequent clock pulse.

Time-expansion circuit 14 operates in a similar manner, although it begins operation on the STOP pulse and ends operation on the second or third subsequent clock pulse.

Figure 3:
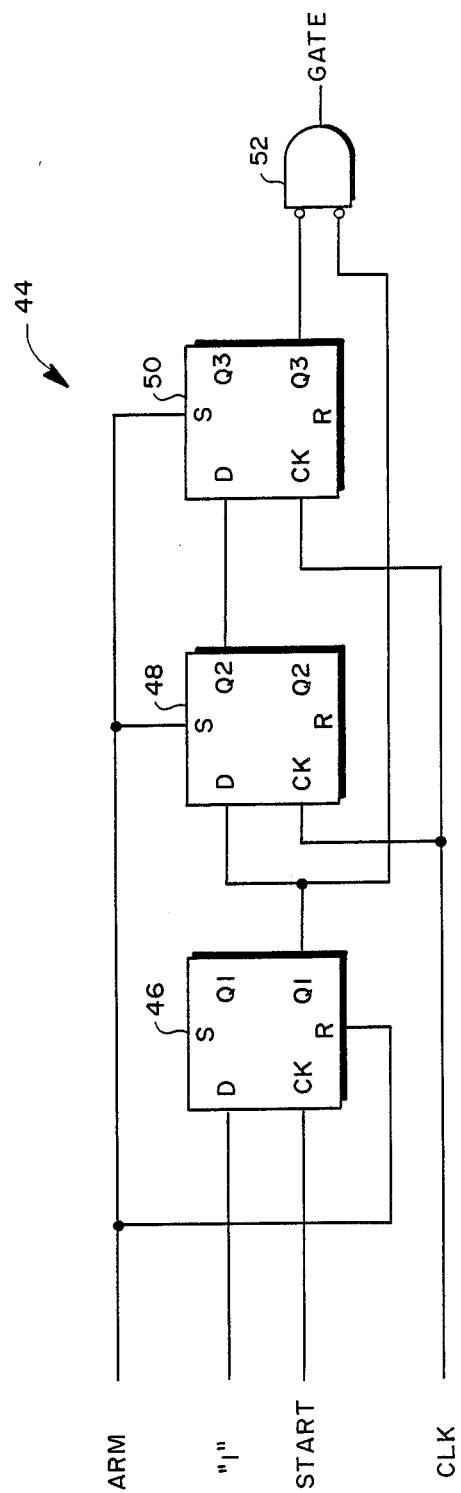
FIG. 3 is a logic diagram of the gate generator 44 of FIG. 2.
Figure 4:
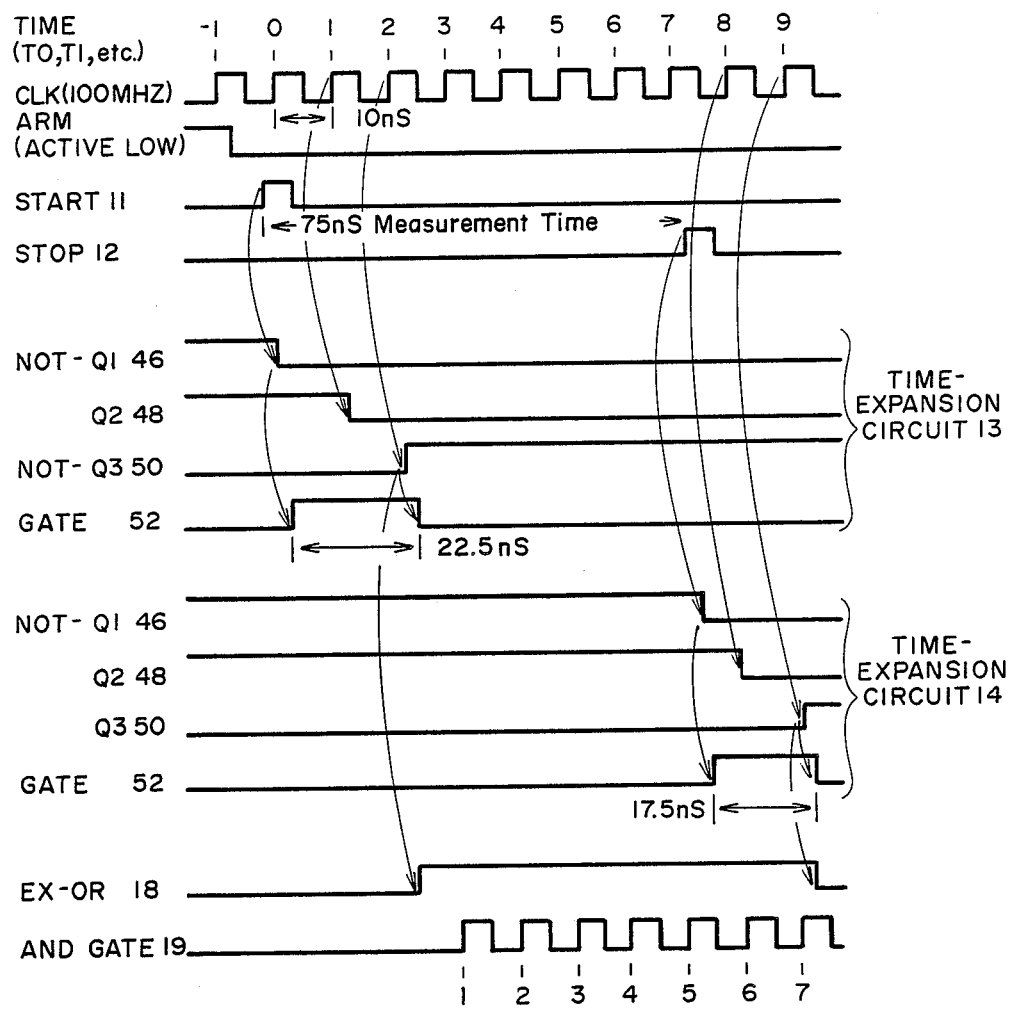
FIG. 4 is a timing diagram depicting certain of the signals present in the time-measurement apparatus.
Figure 2:
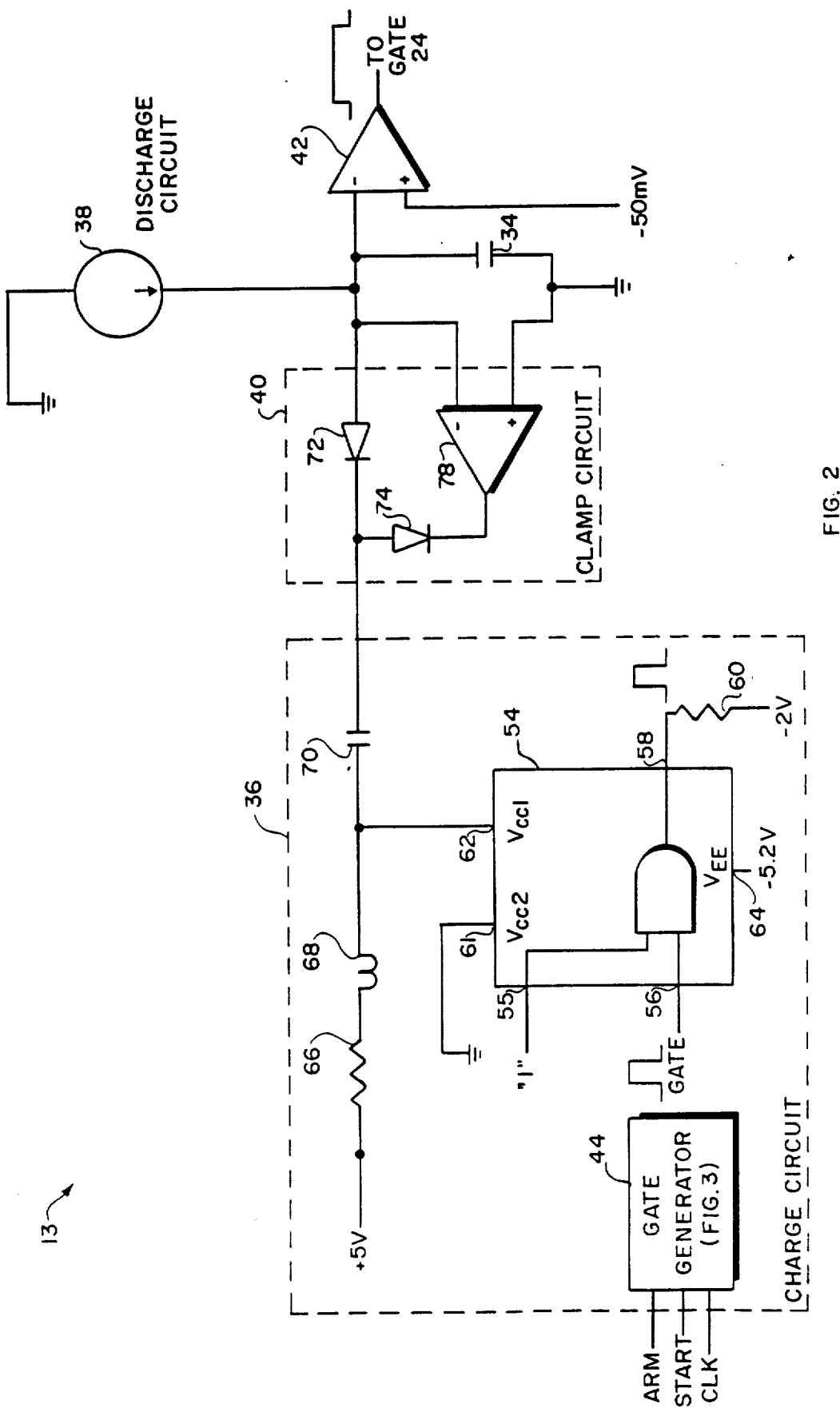

We now turn to a more-detailed description of the time-expansion circuit 13. Initially, control circuitry not shown in the drawings changes an ARM signal to a low level. This enables the gate-generation circuit 44, which will now respond to START and CLK signals. FIG. 3, which depicts the gate-generation circuit 44 in detail, shows that it includes three flip-flops 46, 48, and 50. A high-level ARM signal keeps flip-flop 46 reset, keeps flip-flops 48 and 50 set and keeps all three oblivious to their clock and data inputs. Consequently, the not-$Q_1$ output of flip-flop 46 and the $Q_2$ output of flip-flop 48 are high and the not-$Q_3$ output of flip-flop 50 is low before the ARM signal makes the transition to its low level, as FIG. 4 illustrates.

When ARM goes low, the flip-flops 46, 48, and 50 become free to respond to their other inputs. If a START input pulse then occurs, it immediately clocks flip-flop 46, whose D input port receives a constant logic 1, so the not-$Q_1$ output of flip-flop 46 falls to its low level. The D input port of the second flip-flop 48 receives this output so that, upon the first clock pulse after the not-$Q_1$ transition, the $Q_2$ output of flip-flop 48 falls to the low level. The D input port of the third flip-flop 50 receives this $Q_2$ output, so the not-$Q_3$ signal goes high on the second clock pulse after the not-$Q_1$ transition. Because a clock pulse occurred during the delay between the start pulse and the not-$Q_1$ transition, this is the third clock pulse after the START pulse.

The not-$Q_1$ and not-$Q_3$ signals are applied to inverting input terminals of an AND gate 52, whose output is the GATE signal produced by the gate generator 44 of FIG. 2 to define the charge time of capacitor 34. As can be appreciated by reference to FIGS. 3 and 4, the GATE signal is a pulse whose duration in the illustrated case is the length of the time interval between the START pulse and the third subsequent clock pulse: it goes high when not-$Q_1$ goes low and returns to the low level when not-$Q_3$ goes high. Since it more often happens that a clock pulse does not occur during the delay between the START pulse and the not-$Q_1$ transition, however, the duration is more often defined by the START pulse and the second subsequent clock pulse instead of the third.

One of the reasons for defining the charge time by the second subsequent clock pulse rather than by the first can now be appreciated. The asynchronous relationship between the not-$Q_1$ and clock signals can result in a metastable state in flip-flop 48, and transmission of the resultant signal to AND gate 52 would cause unpredictable results. Flip-flop 48 will have left the metastable state well before the second subsequent clock pulse, however, so the output of flip-flop 50 will be a well-defined logic level when that pulse occurs. It is therefore the not-$Q_3$ signal, which changes state on the second (or third) subsequent clock pulse, that AND gate 52 receives.

FIG. 4 illustrates that the second time-expansion circuit 14 operates in the same manner except that its element corresponding to flip-flop 46 of circuit 13 is clocked by the STOP pulse rather than by the START pulse. Moreover, in the illustrated example, the element corresponding to flip-flop 50 makes its transition on the second, rather than the third, clock pulse after the STOP pulse, since the clock pulse that immediately follows the STOP pulse follows it by more than a gate delay.

FIG. 4 also illustrates the way in which the XOR gate 18 responds to the two not-$Q_3$ outputs of the two time-expansion circuits 13 and 14. It is the output of the XOR gate 18 that enables AND gate 19 to gate clock pulses into the B counter 20, as the last signal in FIG. 14 illustrates.

The GATE output of gate 52 is applied to the input terminal of an emitter-coupled-logic (ECL) chip 54 of FIG. 2. For the sake of simplicity, chip 54 is depicted as a simple AND gate, but there are many ECL gate-circuit configurations that can be utilized for the purpose that will be described below. The chip 54 has an enable terminal 55, which is tied to a logic "1," and an input terminal 56, which receives the GATE signal. The chip 54 also has an output terminal 58 connected to a load consisting of a load resistor 60 connected to a $-2$-volt source.

Terminals 61 and 64 are the $V_{cc2}$ and $V_{EE}$ terminals by which power in an ECL circuit is supplied to all of the chip circuitry except the output stage, and these terminals are connected to ground and $-5.2$ volts in the usual manner. In ECL circuitry, the output drivers are one or more transistors whose collectors are connected in common to a $V_{cc1}$ terminal and whose emitters are connected to the output terminals. Conventionally, the $V_{cc1}$ terminal is connected to ground, just as the $V_{cc2}$ terminal is. The separate connection to ground through the $V_{cc1}$ terminal is provided to eliminate the common-mode noise that would occur if only a single ground terminal were used. In the circuit of FIG. 2, however, the $V_{cc1}$ terminal 62 is connected to a $+5$-volt source through a low-value damping resistor 66 and an inductor 68 connected in series.

Before the GATE signal goes high, very little current flows in the output circuit of the chip 54, and the value of resistor 66, through which this current flows, is such as to cause a drop from the $+5$-volt level of the supply to a $+4$-volt level at $V_{cc1}$ terminal 62 and the left side of a coupling capacitor 70. The other side of capacitor 70 is connected to the connection point of two series-connected Schottky diodes 72 and 74, which are connected between the output and inverting input terminals of a differential amplifier 78. Since the input terminals of the amplifier 78 are connected across capacitor 34, and since the noninverting input terminal is grounded, amplifier 78 draws enough current through diodes 72 and 74 to keep the upper end of capacitor 34 from being charged above ground potential. Therefore, the potential at the right side of capacitor 70 is one diode drop below ground potential before the GATE signal goes high, i.e., to logic 1.

When the gate input signal goes to a logic 1, chip 54 increases its output current to a level set by the value of resistor 60, and the current that it draws at terminal 62 increases suddenly to substantially the same level. Terminal 62 of chip 54 therefore responds as though it were a constant-current step generator. Because of the inductance of inductor 68, however, there is no appreciable change in the current that flows from the $+5$-volt source during a GATE pulse whose duration is on the order of one to two clock periods. The incremental current that chip 54 draws through terminal 62 is therefore supplied by the circuitry to the right of the chip in FIG. 2. Thus, the effect of the inductor is to cause charge circuit 36 to act as a constant-current source, which charges capacitor 34 at a constant rate.

Specifically, capacitors 34 and 70 prevent a sudden change in the voltage at the $V_{cc1}$ terminal 62, so no potential difference is impressed immediately across the inductor 68, and there can thus be no initial change in the current that flows through it. As current flows through those capacitors, however, capacitor 34 charges negatively, so the potential at terminal 62 drops, causing a potential difference across the inductor 68 and thus a change in the current that flows through it. (Since the capacitance of capacitor 70 is very large, its charging can be ignored.) But the duration of two clock periods is small in comparison with the LC time constant—i.e., in comparison with the square root of the product of the inductance of inductor 68 and the capacitance of capacitor 34—so the change in the inductor current is negligible, and the current that the chip 54 draws through capacitor 34 is thus essentially constant.

The rate at which the capacitor 34 charges is determined by the difference between the current drawn by the chip 54 and that driven by the discharge source 38, because the inverting terminal of the amplifier 78 receives the negative voltage on capacitor 34, and the amplifier-78 output therefore goes positive and back-biases diode 74 so that the amplifier 78 can no longer divert the discharge-circuit current.

When GATE subsequently goes low, the current that chip 54 draws returns to its low steady-state value, which is substantially equal to that which flows through inductor 68. The voltage at terminal 62 of chip 54 therefore returns immediately to its steady-state level of +4V. This level change is coupled through capacitor 70 and thereby back-biases diode 72. Accordingly, no further current flows through diode 72, so the charging of capacitor 34 stops.

The discharge current from circuit 38 continues to flow into capacitor 34, however, so the negative voltage on capacitor 34 that accumulated while chip 54 charged it is reduced at a low rate. During this time, the output of comparator 42 remains high, and counter 20 continues counting clock pulses, until capacitor 34 discharges to −50 mV. At that time, the output of comparator 42 goes low to indicate that the expanded time interval is over, and counter 26 thus stops counting clock pulses. Shortly thereafter, the voltage at the upper end of capacitor 34 reaches ground potential, thereby causing amplifier 78 to drive its output port low so as to draw current through diodes 72 and 74. As was explained before, the current that the amplifier draws is exactly enough to divert all of the discharge-circuit current from capacitor 34. Capacitor 34 thus remains in the discharged state until the next occurrence of a GATE pulse.

The other time-expansion circuit 22 works in substantially the same manner, with the exception that it responds to the STOP signal rather than to the START signal. Also, it would typically include a delay circuit to delay the STOP signal by a small increment of time needed to enable the STOP circuitry after the occurrence of a START event. In essence, however, the operation is the same, so the details of the second time-expansion circuit are not separately depicted.

It is of course preferable for the two time-expansion circuits 13 and 14 to charge and discharge their capacitors at the same rates. In addition to contributing to computational simplicity, equal rates result in cancellation of errors that can arise from the initial and terminal parts of the charging and discharging operation, when the effects of the comparator-42 threshold, the switching of the diodes 72 and 74, and stray inductances and capacitances come into play. In principle, however, there is no requirement that the expansion ratios of the two circuits 13 and 14 be the same; it is necessary only that they expand the time segments that they are to measure. In the general case, therefore, the duration that the circuit computes can be specified as $(r_A A + B - r_C C)/F_{CLK}$, where A, B, and C are the counts from the A, B, and C counters, respectively, $r_A$ and $r_C$ are the reciprocals of the expansion ratios of the time-expansion circuits 13 and 14, respectively, and $F_{CLK}$ is the clock frequency.

It is thus apparent that the teachings of the present invention provide significant advantages and can be applied in a wide range of embodiments. Employing the same capacitor for the fast charging and the slow discharging eliminates the need to match capacitors and simplifies the circuitry. Moreover, the charging circuit is readily implemented by employing the $V_{cc1}$ terminal of an ECL integrated circuit to produce a constant-current pulse having short rise and fall times. It is thus apparent that the present invention represents a significant advance in the art.

What is claimed as new and desired to be secured by Letters Patent of the United States is:

1. In an apparatus for measuring the time between first and second events represented by start and stop signals, which apparatus includes a clock for generating periodically occurring clock pulses, initial and final time-expansion circuits for generating initial- and final-segment signals that define initial and final expanded time intervals whose lengths are proportional to the time intervals between the start and stop signals, respectively, and subsequent clock pulses, count means for generating a coarse count by counting the number of clock pulses that occur during an interval whose beginning and end are determined by the start and stop signals, and duration-indication means for generating a signal that represents a length of time computed by combining the initial- and final-segment counts and the coarse count, the improvement wherein each of the initial and final time-expansion circuits includes:

A. a capacitor;
　B. charge means connected to receive the clock pulses and adapted to receive a respective one of the start and stop signals for charging the capacitor at a fast rate from a first reference voltage between the occurrences of the one of the start and stop signals and a subsequent clock pulse;
　C. discharge means for discharging the capacitor at a slow rate back to the reference voltage; and
　D. interval-signal means responsive to the capacitor voltage for generating a respective one of the initial- and final-segment signals that defines an interval that includes at least the time required for the capacitor to discharge back to the threshold voltage.

2. An apparatus as defined in claim 1 wherein the interval defined by each of the initial- and final-segment signals begins when the capacitor begins to be charged from the first reference voltage and ends when the capacitor has discharged back to the reference voltage.

3. For providing a voltage that has a linear relationship to time, an apparatus comprising:

A. an integrated circuit, comprising first and second logic power-application terminals, an output power-application terminal, and at least one emitter-coupled-logic gate circuit including at least one gate input port associated with each gate circuit and a gate output port associated with each gate circuit and adapted for coupling of a predetermined load thereto, for driving the predetermined load, when specified voltages are applied to the power-application terminals and the predetermined load is coupled to the at least one gate output port, with a first predetermined current when a signal representing the first logic state is present at the at least one gate input port and with a second predetermined current when a signal representing the second logic state is present at the at least one input port;

B. a capacitor of a given capacitance having first and second terminals, its first terminal being coupled to the first power-application terminal; and C. a power source coupled to the second terminal of the capacitor for applying a fixed voltage thereto, coupled to the logic power-application terminals for applying the specified voltage thereto, and inductively coupled by a given inductance to the output power-application terminal, whereby the capacitor voltage remains constant when a signal representing one of the logic states remains at the gate input ports for a period of time long in relation to the time constant that characterizes the given inductance and capacitance and, when a signal representing the other of the logic states is present at the gate input ports for a period of time very short in relation to the time constant, the capacitor voltage changes by an amount that bears a linear relationship to the short period of time.

* * * * *

UNITED STATES PATENT AND TRADEMARK OFFICE
CERTIFICATE OF CORRECTION

PATENT NO. : 4,764,694

DATED : August 16, 1988

INVENTOR(S) : Calvin S. Winroth

It is certified that error appears in the above-identified patent and that said Letters Patent is hereby corrected as shown below:

Figure 2 should appear as shown on the attached sheet.

Signed and Sealed this

Twelfth Day of September, 1989

Attest:

DONALD J. QUIGG

*Attesting Officer*                    *Commissioner of Patents and Trademarks*